United States Patent
Miwa

(10) Patent No.: US 10,477,718 B2
(45) Date of Patent: Nov. 12, 2019

(54) ELECTRONIC DEVICE WITH SUPPORTING STRUCTURE OF SUBSTRATE

(71) Applicant: NEC Platforms, Ltd., Kawasaki-shi, Kanagawa (JP)

(72) Inventor: Tomoki Miwa, Kawasaki (JP)

(73) Assignee: NEC PLATFORMS, LTD., Kawasaki-shi, Kanagawa (JP)

( * ) Notice: Subject to any disclaimer, the term of this patent is extended or adjusted under 35 U.S.C. 154(b) by 0 days.

(21) Appl. No.: 15/333,068

(22) Filed: Oct. 24, 2016

(65) Prior Publication Data

US 2017/0118860 A1 Apr. 27, 2017

(30) Foreign Application Priority Data

Oct. 26, 2015 (JP) .................................. 2015-209989

(51) Int. Cl.
*H05K 7/14* (2006.01)
*H05K 7/20* (2006.01)

(52) U.S. Cl.
CPC ......... *H05K 7/1489* (2013.01); *H05K 7/1487* (2013.01); *H05K 7/2039* (2013.01); *H05K 7/20709* (2013.01)

(58) Field of Classification Search
CPC .. H05K 7/1487; H05K 7/1489; H05K 7/2039; H05K 7/20709
USPC ......................................................... 361/752
See application file for complete search history.

(56) References Cited

U.S. PATENT DOCUMENTS

| 3,829,598 A * | 8/1974 | Darnell ................. C04B 41/009 174/16.3 |
| 9,098,251 B2 * | 8/2015 | Zhu .......................... G06F 1/187 |
| 2008/0103637 A1 * | 5/2008 | Bliven ...................... F16B 2/20 701/1 |

FOREIGN PATENT DOCUMENTS

| JP | 54-63153 | 5/1979 |
| JP | 60-130678 | 9/1985 |
| JP | 10-261881 | 9/1998 |
| JP | 2000-114739 | 4/2000 |
| JP | 2002-319652 | 10/2002 |
| JP | 2003-31959 | 1/2003 |
| JP | 2004-335936 | 11/2004 |
| JP | 2006-164040 | 6/2006 |
| JP | 2006-301824 | 11/2006 |
| JP | 2007-128498 | 5/2007 |

(Continued)

OTHER PUBLICATIONS

Machine Translation of Japanese Patent Publication No. 2000-114739 (Apr. 21, 2000).*

(Continued)

*Primary Examiner* — Tremesha S Willis
(74) *Attorney, Agent, or Firm* — Finnegan, Henderson, Farabow, Garrett & Dunner, L.L.P.

(57) ABSTRACT

An electronic device (e.g. a server module) includes a substrate and a supporting member. The supporting member is attached to the peripheral portion of the substrate so as to support the substrate on the mounting surface. Owing to the vertical orientation of the substrate supported by the supporting member, it is possible to reduce any space used to temporarily keep the substrate for the purpose of a maintenance operation or the like. Thus, it is possible to improve the workability of an operator conducting a maintenance operation on the electronic device.

12 Claims, 10 Drawing Sheets

(56) References Cited

FOREIGN PATENT DOCUMENTS

JP          2014-22398          2/2014

OTHER PUBLICATIONS

Machine Translation of Japanese Patent Publication No. 2003-31959 (Jan. 31, 2003).*
Japanese Office Action dated Sep. 13, 2016, by the Japanese Patent Office in counterpart Japanese Patent Application No. 2015-209989.
Japanese Office Action issued by the Japanese Patent Office in counterpart Japanese Patent Application No. 2015-209989 dated Jun. 6, 2017.

* cited by examiner

ELECTRONIC DEVICE WITH SUPPORTING STRUCTURE OF SUBSTRATE

CROSS-REFERENCE TO RELATED APPLICATION

The present application claims the priority benefit of Japanese Patent Application No. 2015-209989 filed on Oct. 26, 2015, the subject matter of which is hereby incorporated herein by reference.

BACKGROUND OF THE INVENTION

1. Field of the Invention

The present invention generally relates to an electronic device, in particular, to a module installed in a server as well as a supporting structure of a substrate installed in an electronic device.

2. Description of Related Art

Conventionally, various types of modules installed in servers have been developed and disclosed in various documents. Modules have substrates with connecting members connectible to connectors mounted on motherboards. Patent Document 1 (i.e. Japanese Patent Application Publication No. 2014-22398) discloses an electronic device, e.g. a motherboard for use in a server on which heat generated by a CPU is dissipated using a heatsink and a cooling fan. Patent Document 2 (i.e. Japanese Patent Application Publication No. 2007-128498) discloses a computer system for use in a server in which multiple server modules are installed in a rack via a back panel aimed for power supply and signal transmission. Patent Document 3 (i.e. Japanese Patent Application Publication No. 2006-301824) discloses a complex computer apparatus combining multiple processor modules in a single housing. Patent Document 4 (i.e. Japanese Patent Application Publication No. 2006-164040) discloses a blade server accommodating multiple blade units in a rack via a backplane and connectors.

The conventional arts relating to servers are disadvantageous in that operators (e.g. electricians or maintenance mechanics) need to attach or detach numerous electronic parts in servers by hand. Occasionally, operators may temporarily hold electronic parts in the surrounding areas of servers, before they are installed in servers or after they are removed from servers, although it is difficult to secure adequate spaces for temporarily holding all electronic parts for replacement or maintenance in the surrounding areas of servers. This may deteriorate the workability of operators handling electronic parts for servers due to lack of adequate spaces for temporarily holding electronic parts secured in the surrounding areas of servers.

The present invention aims to improve the workability of operators for replacement or maintenance of electronic parts installed in servers by introducing a server module structure including a support member vertically supporting a substrate, thus eliminating the necessity of securing adequate space for replacement or maintenance of electronic parts in the surrounding areas of servers.

SUMMARY OF THE INVENTION

In a first aspect of the present invention, an electronic device includes a substrate and a supporting member. The supporting member is attached to the peripheral portion of the substrate so as to support the substrate standing.

In a second aspect of the present invention, a server includes a connector, an electronic device, and a housing. The electronic device further includes a substrate and a supporting member. A connecting part connectible to the connector is attached to the peripheral portion of the substrate. The supporting member is attached to the peripheral portion of the substrate so as to support the substrate standing. The housing accommodates the electronic device whose connecting part is connected to the connector.

In a third aspect of the present invention, a cover member includes a side cover and a cover unit. The side cover covers at least one face of a substrate in its thickness direction. Herein, a supporting member is attached to the peripheral portion of the substrate so as to support the substrate standing. The cover unit covers a part of the peripheral portion opposite to the supporting member. The cover member further includes an interconnecting member connectible to the supporting member.

According to the present invention, it is possible to improve the workability of an operator conducting a maintenance operation on an electronic device (e.g. a server module) because it is possible to eliminate the necessity of providing any space for temporarily keeping electronic devices by means of the supporting structure of supporting substrates standing.

DETAILED DESCRIPTION OF THE EMBODIMENTS

Figure 1:
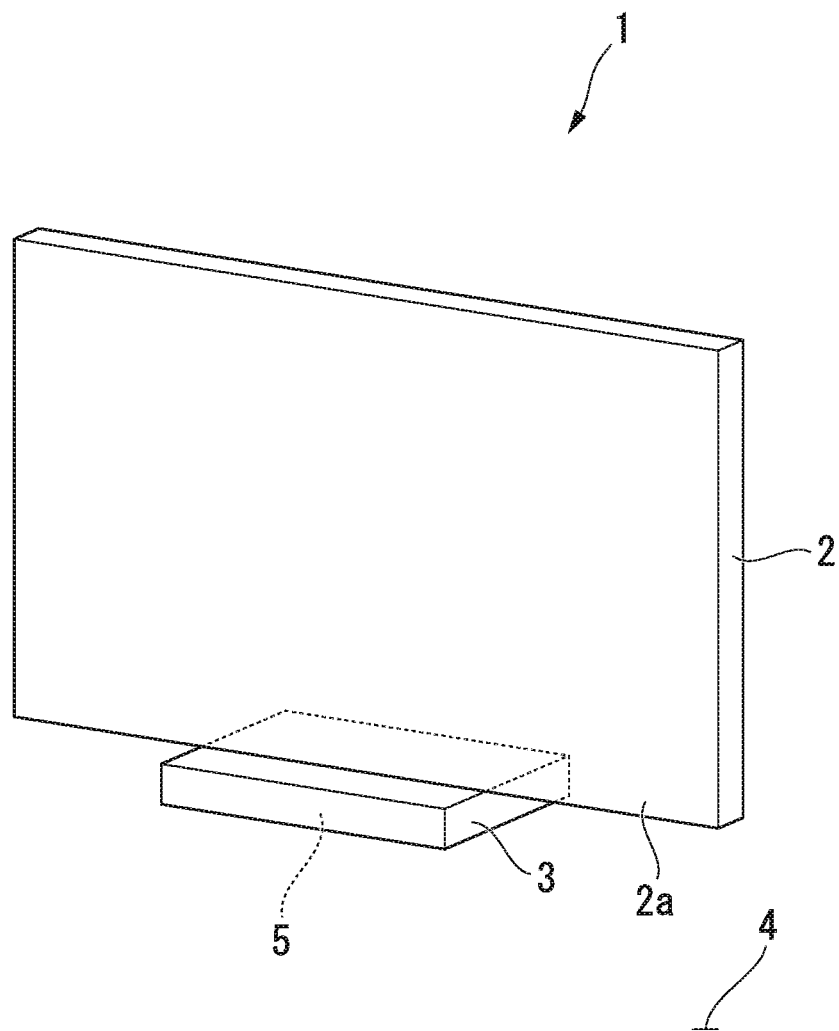
FIG. 1 is a perspective view of an electric device according to the first embodiment of the present invention

Electronic devices (e.g. server modules) according to the present invention will be described in detail by way of examples with reference to the accompanying drawings, wherein parts identical to those shown in multiple drawings will be denoted using the same reference numerals.

First Embodiment

FIG. 1 is a perspective view of an electric device 1 according to the first embodiment of the present invention. The electronic device 1 includes a substrate 2 and a supporting member 3. For example, various types of electronic parts such as wires, semiconductor parts, and power circuits are mounted on the substrate 2.

The support member 3 is designed to vertically support the substrate 2 on a mounting surface 4 such as a floor surface and a desk surface having a horizontal plane. The support member 3 is fixed to a peripheral portion 2a of the substrate 2. According to the first embodiment, the supporting member 3 has a supporting face 5 allowing for a surface contact with the mounting surface 4. The supporting face 5 of the supporting member 3 is expanded in a direction crossing the substrate 2, in other words, in a thickness direction of the substrate 2.

The first embodiment exemplifies the supporting face 5 having a plane shape; but this is not a restriction. It is possible for the supporting member 3 to employ any shape allowing the substrate 2 to stand thereon; hence, the supporting member 3 does not necessarily include the supporting face 5. For example, the supporting member 3 may have three or more supporting points which come in contact with the mounting surface 4.

FIG. 1 shows the substrate 2 having a rectangular shape; however, this is not a restriction. The substrate 2 is not limited to a rectangular shape. FIG. 1 shows a single supporting member 3 adapted to a single substrate 2; but this is not a restriction. It is possible to provide multiple supporting members 3 with respect to a single substrate 2.

According to the first embodiment, the substrate 2 is vertically supported by the supporting member 3. For this reason, it is possible to reduce a space for temporarily keeping the substrate 1 according to the first embodiment compared to the conventional art for keeping the substrate 2 laid on the mounting surface 4. As a result, it is possible to improve the workability of maintenance. By using the supporting member 3 having the supporting face 5, it is possible to stably support the substrate 2 vertically standing on the plane expanded in the thickness direction of the substrate 2.

Second Embodiment

Next, an electronic device (e.g. a server module) according to the second embodiment of the present invention will be described with reference to FIGS. 2 and 3, wherein parts identical to those shown in FIG. 1 are denoted using the same reference signs.

Figure 2:
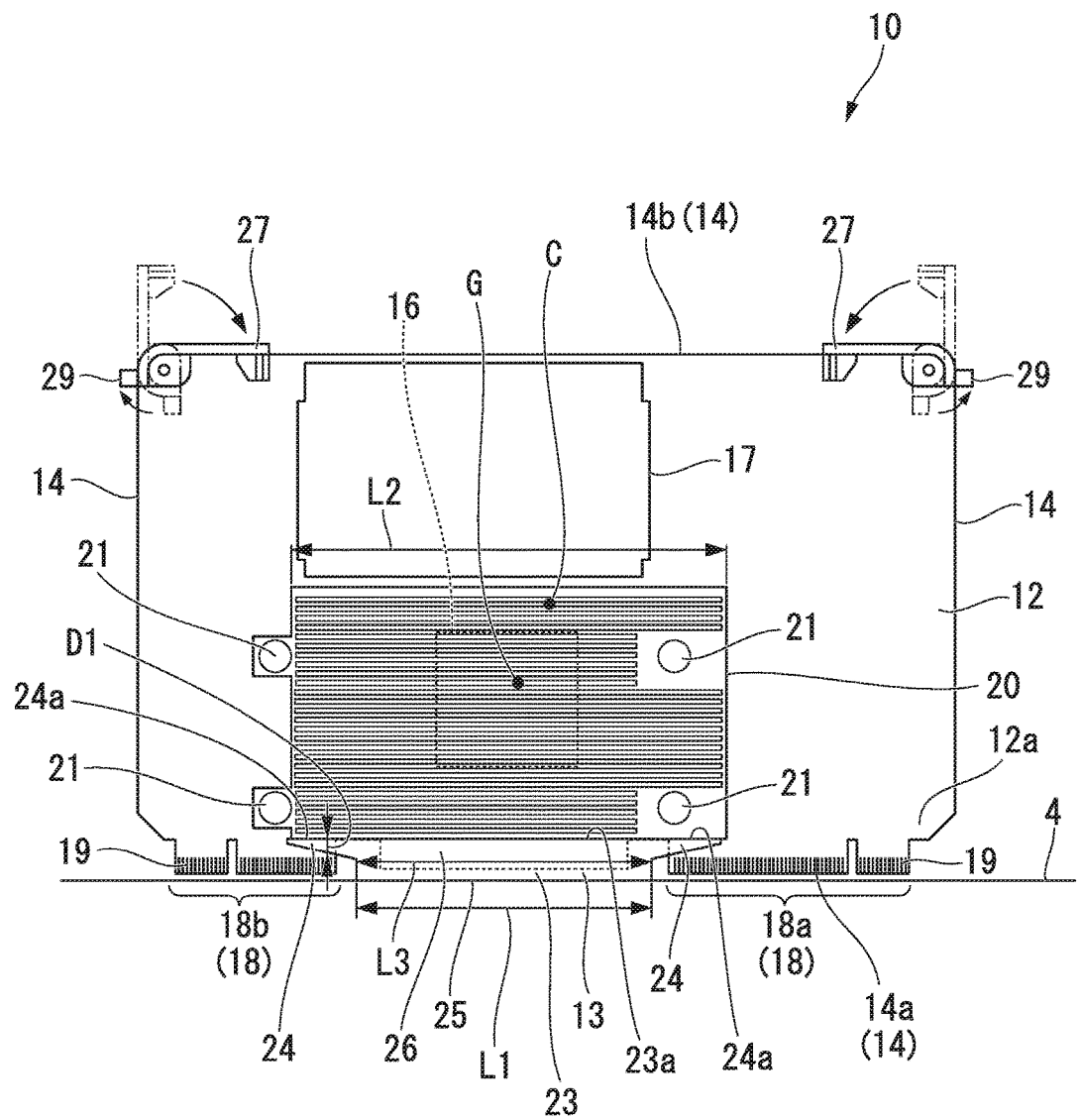
FIG. 2 is a front view of an electronic device, serving as a server module, according to the second embodiment of the present invention.

FIG. 2 is a front view of an electronic device 10 according to the second embodiment. FIG. 3 is an exploded perspective view of the electronic device 10 according to the second embodiment. For example, the electronic device 10 of the second embodiment serves as a module which can be detachably attached to a computer having a server function. That is, the server module 10 is able to apply various functions to a server. As the module 10, it is possible to name a CPU module, a storage module, and an I/O module. The module 10 includes a substrate 12 and a supporting member 13.

The substrate 12 is formed using a printed circuit board (PCB) having a. multilayered substrate and wiring. Additionally, various parts such as semiconductor parts (e.g. a CPU), storage units (e.g. a hard-disk drive), and memory slots are mounted on at least one of the surface and the back face of the PCB. The second embodiment will be described with respect to an example of the substrate 12 which a CPU 16 and a memory slot 17 are mounted on.

Figure 3:
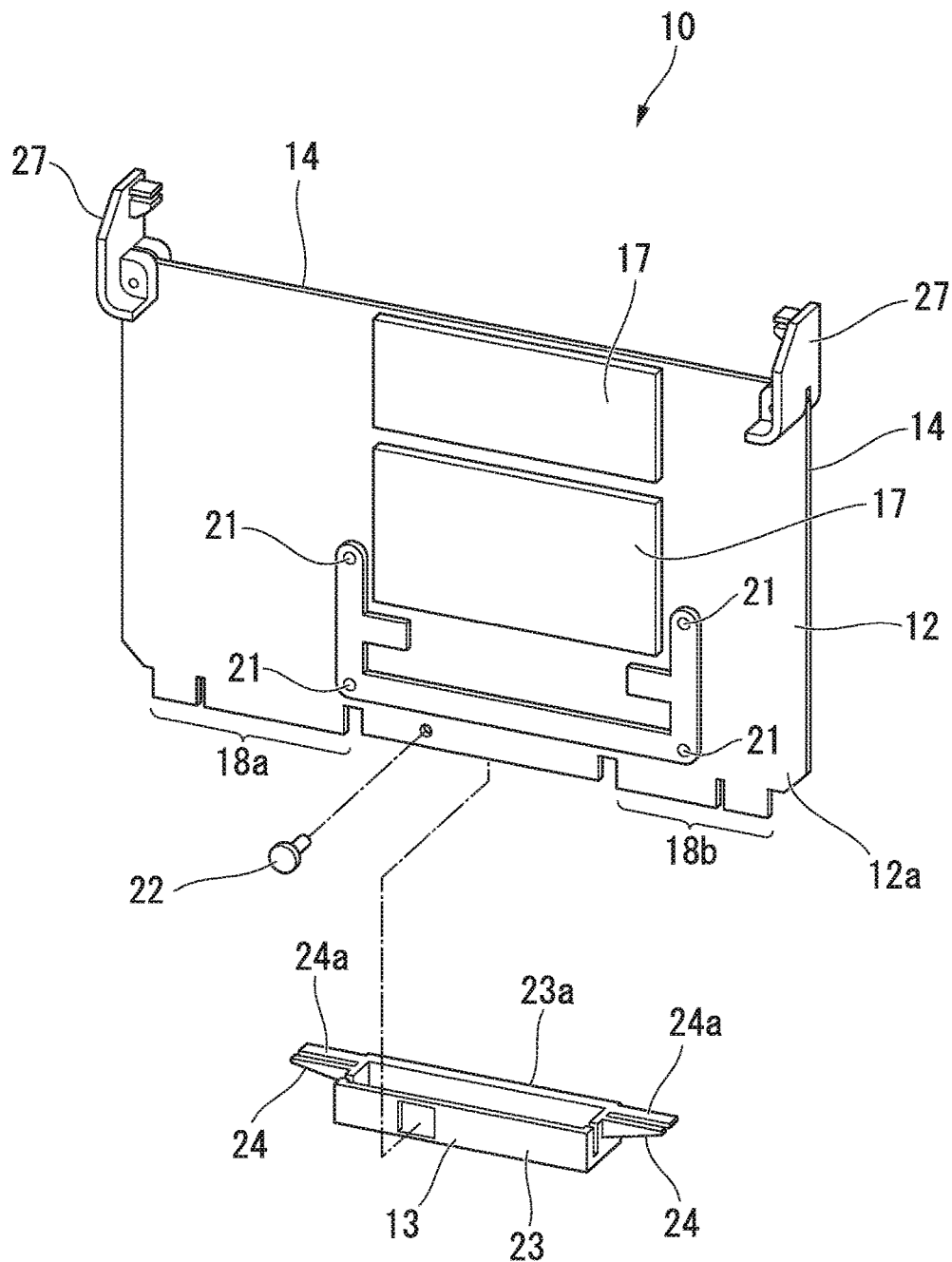
FIG. 3 is an exploded perspective view of the electronic device according to the second embodiment of the present invention.

As shown in FIGS. 2 and 3, the substrate 12 is formed as a rectangular flat plate having four linear sides 14 in its peripheral portion 12a. A connecting part 18 is attached to a front side 14a among four sides 14 of the substrate 12. The connecting part 18 is dispersed into two connecting parts 18a, 18b which are dispersively arranged and separated from each other along the front side 14a. The connecting parts 18a, 18b include a plurality of electrodes 19 aligned along the front side 14a of the substrate 12. The connecting parts 18a, 18b can be connected to (or inserted into) or disconnected from (or extracted from) connectors of a computer. Herein, the connection/disconnection direction (or the insertion/extraction direction) of the connecting parts 18a, 18b being connected to or disconnected from connectors is perpendicular to the front side 14a of the substrate 12.

The CPU 16 is attached to a predetermined position of the substrate 12 closer to the front side 14a rather than the memory slot 17, in other words, a front side of the substrate 12 equipped with the connecting parts 18a, 18b being inserted into connectors (hereinafter, referred to as a forward insertion side of the substrate 12). A heat sink 20 is attached to the CPU 16 to cool down heat generated by the CPU 16. The heat sink 20 is fixed to the substrate 12 by means of fastening members 21 such as screws (e.g. vises). The CPU 16 equipped with the heat sink 20 is much heavier than other parts such as the memory slot 17 equipped with a memory module. For this reason, the center of gravity G of the substrate 12 depending on the arrangement of the heat sink 20 is positioned in the forward insertion side rather than the center C of the substrate 12.

For example, the supporting member 13 supports the substrate 12 to stand on the mounting surface 4 such as a plane surface or a desk surface. The supporting member 13 is attached to the peripheral portion 12a of the substrate 12. Specifically, the supporting member 13 is attached to the front side 14a of the peripheral portion 12a of the substrate 12 close to the center of gravity G. The supporting member 13 is fixed to the peripheral portion 12a of the substrate 12 by means of a fastening member 22 such as a screw (e.g. a vis).

As shown in FIG. 3, the supporting member 13 includes a main unit 23 and a contact prevention part 24. The main unit 23 and the contact prevention part 24 are integrally formed together using a resin or the like.

The main unit 23 is able to support the substrate 12 to stand in a direction crossing the mounting surface 4. As shown in FIG. 2, the main unit 23 has a supporting face 25 corresponding to a plane expanded in the thickness direction of the substrate 12. That is, the main unit 23 of the supporting member 13 according to the second embodiment is able to support the substrate 12 to stand vertically on the mounting surface 4. The supporting member 13 is attached to the substrate 12 such that the main unit 23 is positioned adjacent to the heat sink 20. Specifically,the main unit 23 is interposed between the connecting parts 18a and 18b along the front side 14a.

The supporting face 25 of the main unit 23 is positioned in the forward insertion side of the substrate 12 slightly closer to the mounting surface 4 rather than the connecting parts 18a, 18b. Thus, the supporting face 25 of the main unit 23 is solely brought into contact with the mounting surface 4 when the substrate 12 is disposed vertically on the mounting surface 4, and therefore the substrate 12 is separated from the mounting surface 4.

The main unit 23 has a side face 26 which is positioned outside the heat sink 20 in the thickness direction of the substrate 12. That is, the thickness of the main unit 23 measured in the thickness direction of the substrate 12 is larger than the thickness of the heat sink 20. This prevents the heat sink 20 from protruding outside the main unit 23 in the thickness direction of the substrate 12. The heat sink 20 has a length L2 (along the front side 14a) is larger than a distance L1 between the connecting parts 18a and 18b. Thus, the main unit 23 of the supporting member 13 has a length L3 smaller than the length L2 of the heat sink 20.

The contact prevention part 24 of the supporting member 13 covers the heat sink 20 so as to prevent an operator from touching the heat sink 20 by his/her hand. Specifically, the contact prevention part 24 covers a part of the heat sink 20 which is close to the front side 14a but is not completely covered by the main unit 23. In the second embodiment, the supporting member 13 has two contact prevention parts 24 positioned outside the opposite ends of the main unit 23 along the front side 14a. The contact prevention parts 24 have faces 24a formed continuously with an upper face 23a of the main unit 23 directing toward the heat sink 20. As shown in FIG. 2, the contact prevention part 24 has an elongated triangular shape in a front view such that the thickness D1 thereof is gradually reduced from the inside to the outside departing from the main unit 23 along the front side 14a.

The substrate 12 is equipped with latches 27, which are attached to the opposite ends of a rear side 14b (opposite to the front side 14a among four sides 14) in the peripheral portion 12a. The latches 27 have rotation axes extended in the thickness direction of the substrate 12. The latches 27 can be pivotally rotated about rotation axes in a range between the installing position (where an operator installs the module 10 in a computer such as a server, see solid lines representing the latches 27) and the holding position (where an operator holds the module 10 upwardly, see dashed lines representing the latches 27). In the second embodiment, two latches 27 are attached to the opposite corners of the substrate 12 such that they can be rotated close to each other along the rear side 14b. Thus, it is possible for an operator to easily install or extracts the module 10, carry the module 10, and operate the module 10 being vertically standing on the mounting surface 4 since an operator can hold two latches 27, rotated at the holding position, with left/right hands.

The latches 27 have projections 29 which are displaced due to the pivotal rotation thereof. Owing to the formation of the projections 29, for example, an operator can pivotally rotate the latches 27 at the installed position while hanging the projections 29 at a chassis storing a computer therein. This causes a ladder effect allowing the module 10 to be pushed into the connectors which are positioned opposite to the connecting parts 18. Additionally, the ladder effect may prevent the connecting parts 18 of the module 19 from being unexpectedly disconnected from the connectors.

According to the second embodiment similar to the first embodiment, it is possible to support the module 10 standing on the mounting surface 4 by means of the supporting member 13. Compared to the conventional art for keeping the module 10 being horizontally laid on the mounting surface 4, the second embodiment can reduce a space for temporarily keeping the module 10. As a result, it is possible to improve the workability in maintenance.

Owing to the supporting face 25 of the supporting member 13 which expands in the thickness direction of the substrate 12, it is possible to stably support the module 10 at the vertical orientation.

Additionally, the second embodiment can determine the center of gravity G of the substrate 12 at a predetermined position closer to the supporting member 13. For this reason, it is possible to determine the center of gravity G of the substrate to be lower than the center C when the module 10 is supported by the supporting member 13 disposed in the lower side of the substrate 12. This may lower the center of gravity of the module 10 at the vertical orientation; hence, it is possible to stably hold the module 10 at the vertical orientation.

Moreover, it is possible to prevent the electrodes 19 from being brought into contact with the mounting surface 4 at the vertical orientation of the module 10 whose substrate 12 vertically stands on the mounting surface 4. That is, it is possible to protect the electrodes 19 at the vertical orientation of the module 10.

In the module 10, the supporting member 13 is arranged in the peripheral portion 12a of the substrate 12 close to the heat sink 20. In other words, the supporting member 13 is positioned to cover an easy-to-contact area of the module 10 in which an operator's hand conducting a maintenance operation may accidentally touch the heat sink 20. For this reason, it is possible to prevent an operator's hand from accidentally touching the heat sink 20.

Owing to the formation of the contact prevention parts 24 in the supporting member 13, it is possible to cover an uncovered area of the module 10, which cannot be covered by the main unit 23 of the supporting member 13, within the entire surface of the heat sink 20 oriented in the forward insertion side. As a result, it is possible to reliably prevent an operator's hand from accidentally touching the heat sink 20.

The second embodiment is described such that the center of gravity G of the module 10 is deviated from the center C due to the weight of the heat sink 20. However, the module 10 may include various weighted parts which are not limited to the heat sink 20 but which can be referred to a HDD (i.e. a hard disk drive). This nonrestrictive matter can be applied to other embodiments and variations.

The second embodiment refers to an example of the vertical orientation of the substrate 12 supported by the supporting member 13 in which the substrate 12 is positioned to vertically stand on the mounting surface 4. However, it is not necessary for the substrate 12 to vertically stand on the mounting surface 4. The supporting member 13 needs to support the substrate 12 such that a virtual plane (corresponding the front and back faces of the substrate 12 being extended in the space) be crossing the mounting surface 4 at an arbitrary angle. For example, the supporting member 13 can support the substrate 12 to be inclined to the mounting surface 4. In this case, the supporting face 25 should be expanded in the thickness direction of the substrate 12 and formed with a plane inclined to the front and back faces of the substrate 12.

Third Embodiment

Next, the third embodiment of the present invention will be described with reference to FIGS. 4 to 7, wherein parts identical to those shown in FIGS. 1 to 3 are denoted using the same reference signs; hence, duplicate descriptions thereof will be omitted.

Figure 4:
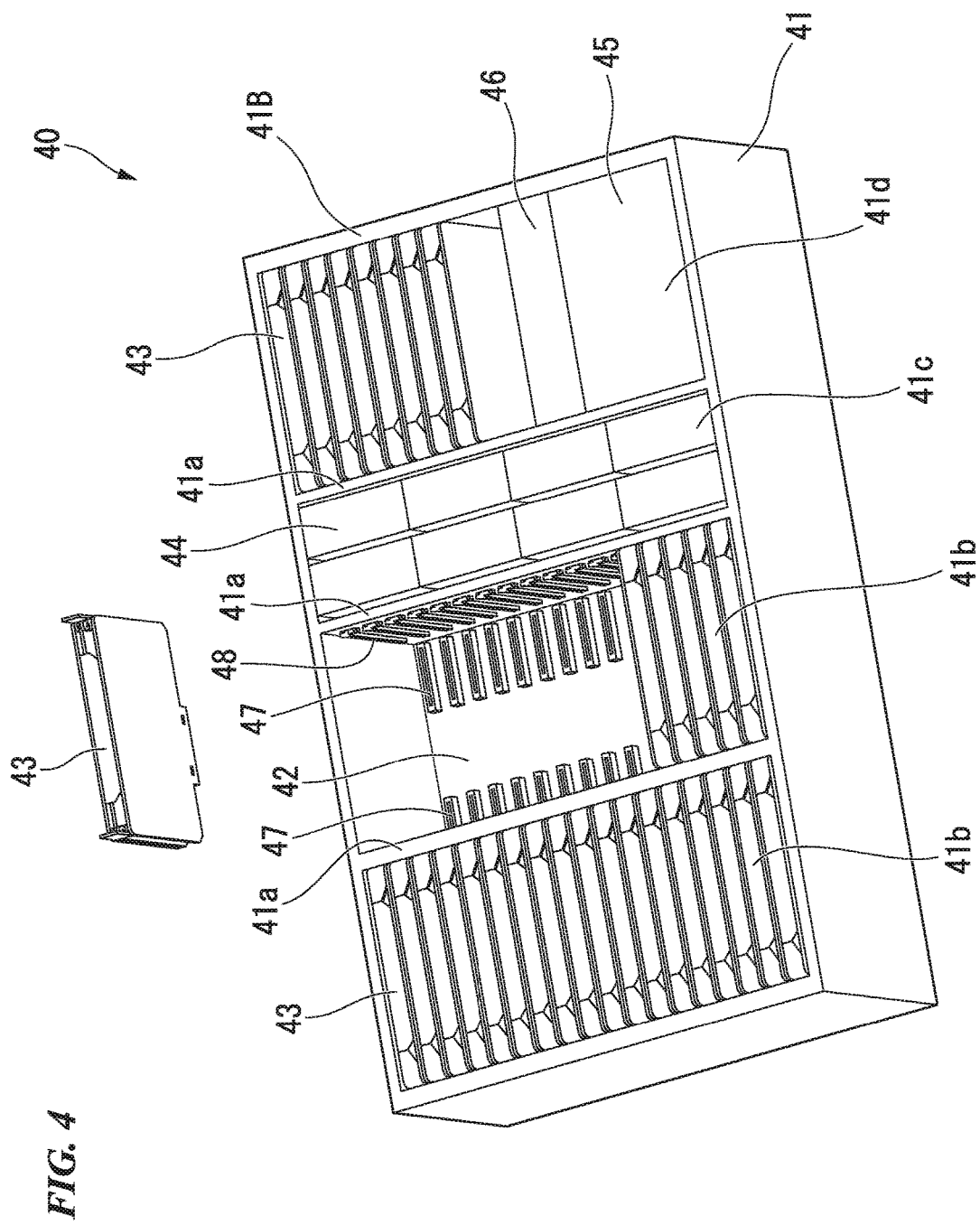
FIG. 4 is a perspective view of a server according to the third embodiment of the present invention.

FIG. 4 is a perspective view of a server 40 according to the third embodiment of the present invention. The server 40 includes a chassis 41, a baseboard 42, a plurality of server modules 43, a plurality of fan modules 44, a power unit 45, and a communication unit 46.

The chassis 41 stores at least the baseboard 42, the server modules 43, the fan modules 44, the power unit 45, and the communication unit 46. The chassis 41 is formed as a rectangular box having an upper opening in a plan view. For example, the chassis 41 is supported by a rack such that it can be slidably moved in a forward-backward direction. An operator can access the inside of the chassis 41 which is pulled out of a rack in a forward direction. Additionally, an operator can push the chassis 41, once it is pulled out of a rack, backwardly into a rack.

According to the fourth embodiment, the chassis 41 of the server 40 has a longitudinal shape which is elongated in a front-rear direction (or a lengthwise direction), wherein the power unit 45 is installed in the rear side of the chassis 41.

By forming a plurality of partition members 41a in the chassis 41, the internal space of the chassis 41 is divided into a plurality of blocks in the lengthwise direction. A plurality of through-holes are formed in the partition members 41a such that cooling air can be transmitted through the partition members 1a in the lengthwise direction. By the partition members 41a, the inside space of the chassis 41 is divided into server-module storage blocks 41b, a fan-module storage block 41c, and a reserve storage block 41d in the front-rear direction.

Two server-module storage blocks 41b are arranged to adjoin together in the lengthwise direction of the chassis 41. The server-module storage block 41b stores a plurality of server modules 43. Numerous server modules 43 can be stored in the server-module storage block 41b in such a way that the thickness direction of each server module 43 matches the width direction (or the crosswise direction) of the chassis 41. In other words, two server-module storage blocks 41b can accommodate numeral server modules 43 which are closely kept together in its thickness direction.

The fan-module storage block 41c is interposed between the server-module storage area 41b and the reserve storage block 41d in the lengthwise direction of the chassis 41. The fan-module block 41c accommodates a plurality of fan modules 44. A plurality of fan modules 44 are stored in the fan-module storage block 41c such that numerous rotation axes of the fan modules 44 each laid in the lengthwise direction of the chassis 41 are aligned in the crosswise direction of the chassis 41. Specifically, the fan modules 44 are aligned in two lines inside the fan-module storage block 41c such that each pair of fan modules 44 are linearly aligned in the lengthwise direction of the chassis 41. The fan modules 44 cause cooling air flowing from the front side to the rear side in the chassis 41.

The reserve storage block 41d can accommodate a plurality of server modules 43, the power unit 45, and the communication unit 46. Specifically, the reserve storage block 41d can accommodate the server module(s) 43 in the residual space precluding the power unit 45 and the communication unit 46. The power unit 45 and the communication unit 46 have cables which can be pulled out of the rear side of the chassis 41 and connected to external devices arranged outside the server 40.

The baseboard 42 is fixed onto the bottom face of the chassis 41. The baseboard 42 is formed as a sheet extended over the server-module storage blocks 41b, the fan-module storage block 41c, and the reserve storage block 41d. The baseboard 42 includes wirings, connectors 47, and other connectors.

A plurality of connectors 47 are attached to the bottom of the server-module storage blocks 41b and the reserve storage block 41d. The connectors 47 are aligned in front and rear rows in the server-module storage block 41b in the crosswise direction of the chassis 41 such that they are aligned adjacent to each other with a predetermined interval, slightly larger than the thickness of each server module 43, therebetween. Similarly, the connectors 47 are aligned in a server-module storage area of the reserve storage block 41d. In the server-module storage area of the reserve storage block 41d, the connectors 47 are aligned in front and rear rows in the crosswise direction of the chassis 41 such that they are aligned adjacent to each other with a predetermined interval, slightly larger than the thickness of the server module 43, therebetween.

The connecting parts 18 of the substrate 12 installed in the server module 43 can he connected to or disconnected from the connectors 47 in a direction perpendicular to the baseboard 42. The connectors 47 have multiple electrodes which can be electrically connected to the electrodes 19 of the connecting parts 18 when connected to the connectors 47. The server-module storage block 41b is formed between a pair of partition members 41a which are distanced from each other in the lengthwise direction of the chassis 41, wherein a plurality of guide rails 48 are attached to the interior walls of the partition members 41a so as to guide the server modules 43 in the insertion/extraction direction. Similarly, the reserve storage block 41d is formed between the partition member 41a and a rear face 41B of the chassis 41 which are distanced from each other in the lengthwise direction of the chassis 41, wherein a plurality of guide rails 48 are attached to the interior walls of the partition member 41a and the rear face 41B of the chassis 41 so as to guide the server modules 43 in the insertion/extraction direction.

FIG. 4 does not show the details of the chassis 41, but the baseboard 42 has a plurality of other connectors which can be electrically connected to the fan modules 44 in the fan-module storage block 41c. Electric power is applied to the fan modules 44 through other connectors so as to drive fans.

Figure 5:
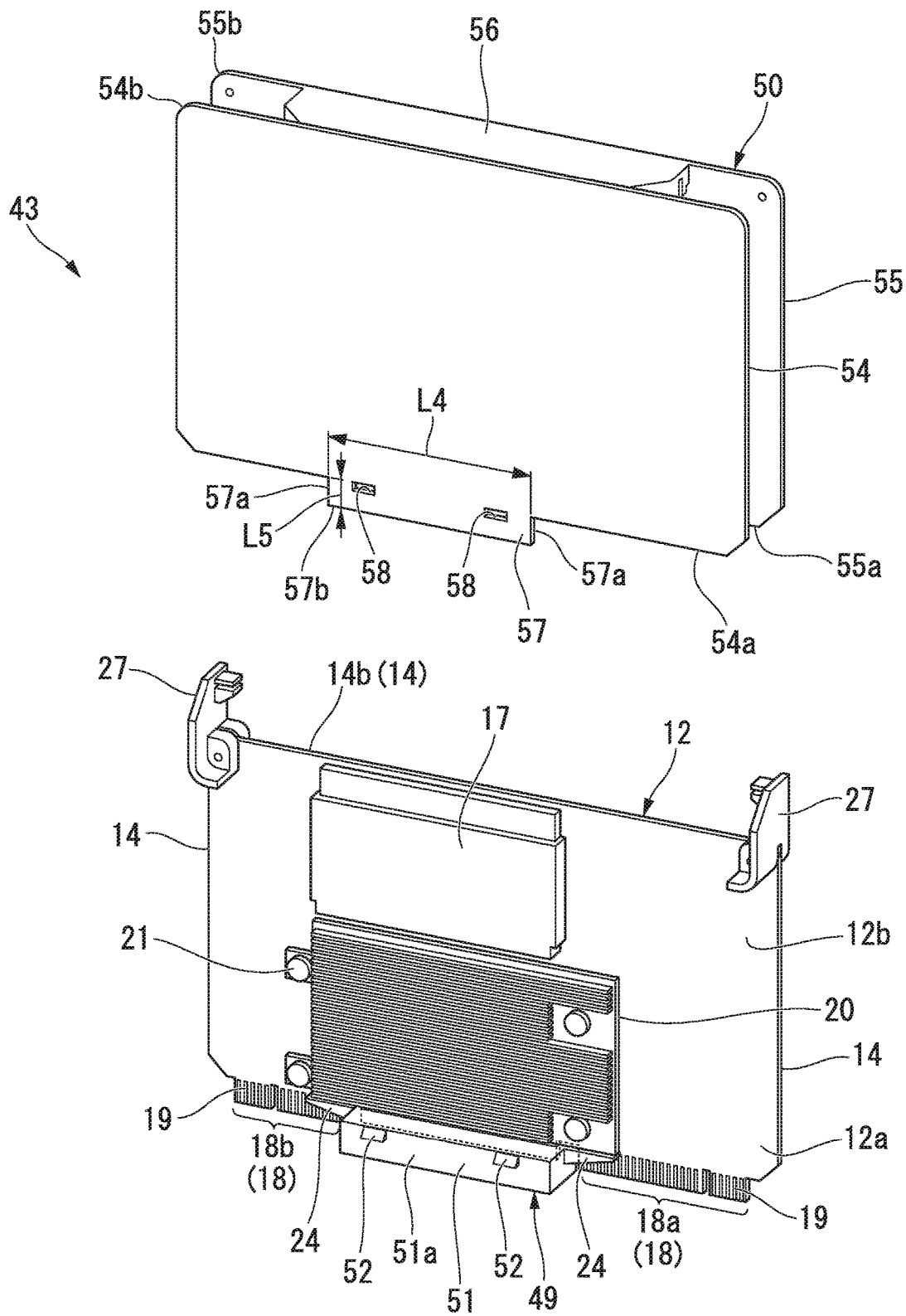
FIG. 5 is an exploded perspective view showing the assembly of a server module including a cover member, a substrate, and a supporting member according to the third embodiment of the present invention.
Figure 6:
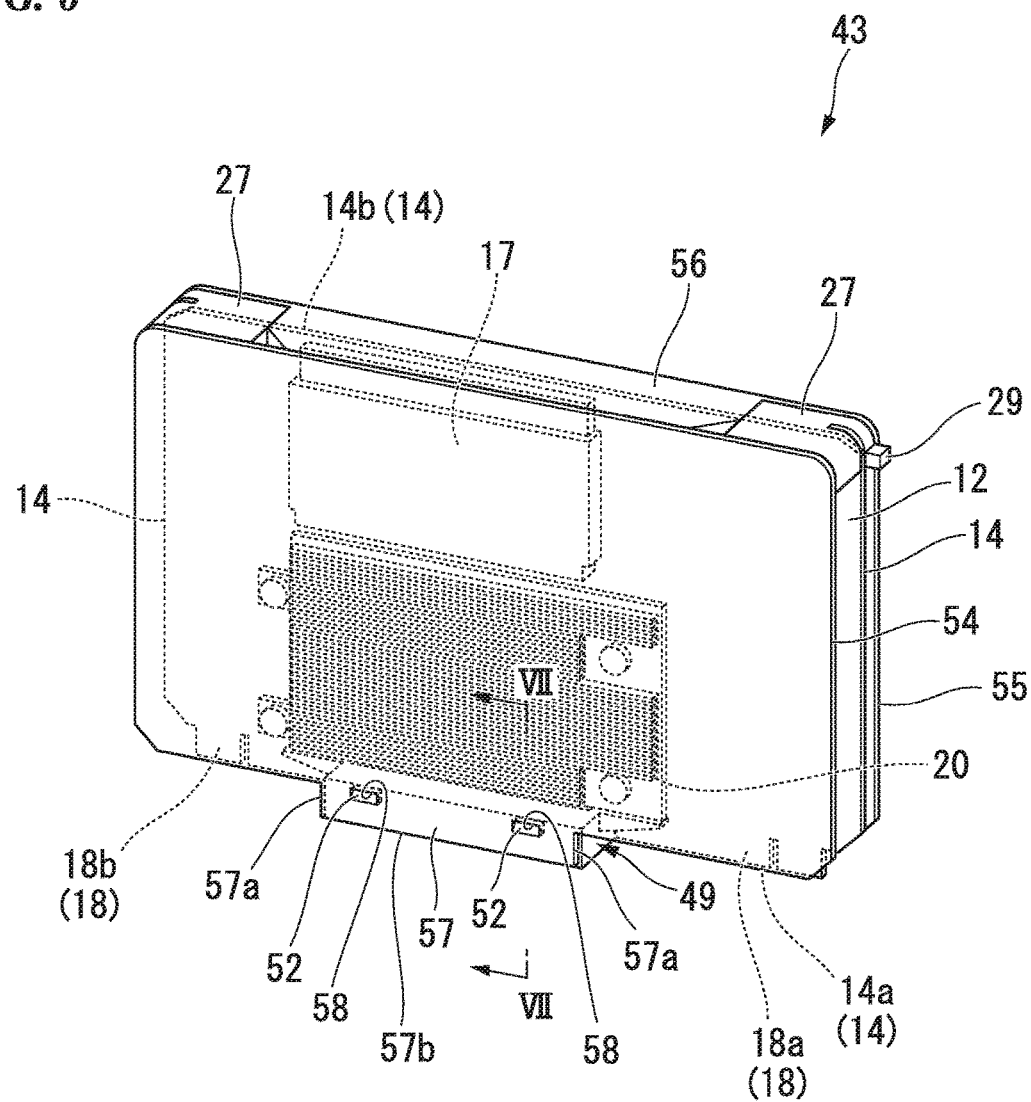
FIG. 6 is a partially-enlarged perspective view of the server module according to the third embodiment of the present invention.
Figure 7:
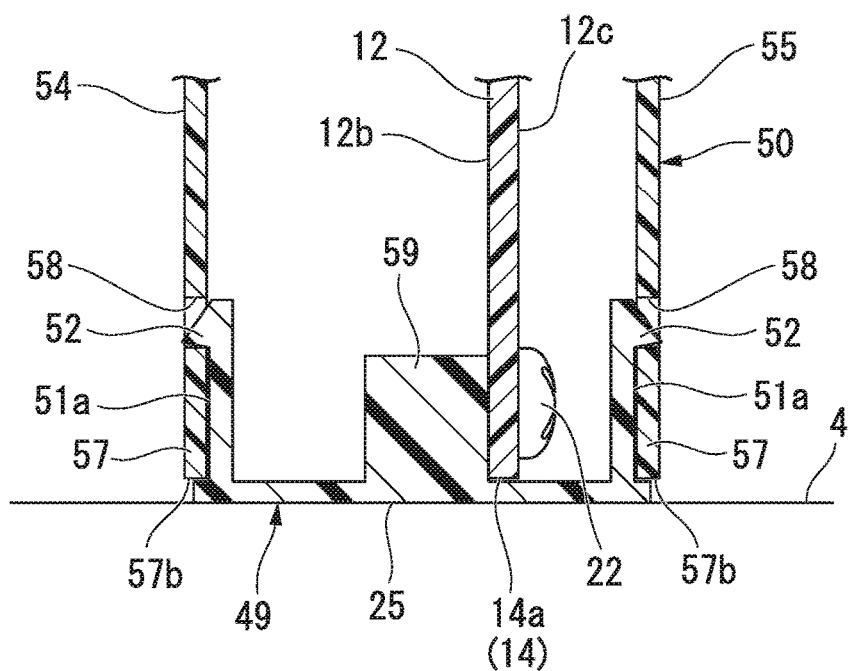
FIG. 7 is a cross-sectional view taken along line VII-VII in FIG. 6.

FIG. 5 is an exploded perspective view showing the assembly of the server module 43 according to the third embodiment of the present invention. FIG. 6 is a partially-enlarged perspective view of the server module 43. FIG. 7 is a cross-sectional view taken along line VII-VII in FIG. 6.

The server module 43 is a module having a server function equipped with a CPU and the heat sink 20 used to cool down heat generated by the CPU. As shown in FIG. 5, the server module 43 includes the substrate 12, a supporting member 49, and a cover member 50.

Similar to the supporting member 13 of the second embodiment, the supporting member 49 is attached to the peripheral portion 12a of the substrate 12. That is, the supporting member 49 is attached to the front side 14a, close to the center of gravity G, in the peripheral portion 12a of the substrate 12. The supporting member 49 is fixed to the peripheral portion 12a of the substrate 12 by means of the fastening member 22 (e.g. a vis).

Similar to the supporting member 13 of the second embodiment, the supporting member 49 includes a main unit 51 and the contact prevention parts 24. The supporting face 25 of the supporting member 49 is formed not to be brought into contact with an intermediate part of the base board 42 or an intermediate part of the chassis 41 interposed between the connecting members 18a, 18b being connected to the connectors 47. Owing to the above formation of the supporting member 49 and the supporting face 25, it is possible to prevent the connecting parts 18a, 18b from being appropriately connected to the connectors 47 since the supporting member 49 is unexpectedly brought into contact with the baseboard 42 or the chassis 41. That is, it is possible to prevent contact failure since the connecting parts 18a, 18b are not adequately engaged with the connectors 47.

As shown in FIGS. 5 to 7, the main unit 51 of the supporting member 49 has two side faces 51a (FIG. 5 shows one side face 51a alone), each of which is equipped with locking claws (or interlocking members) 52 and which are formed outwardly in the thickness direction of the substrate 12. The main unit 51 of the supporting member 49 is structurally similar to the main unit 23 of the supporting member 13 except for the locking claws 52. The main unit 52 of the supporting member 49 includes two locking claws 52, which are separated from each other along the front side 14a, with respect to each of two side faces 51a.

The cover member 50 is configured to cover the substrate 12 and the supporting member 49. In other words, the cover member 50 at least covers the peripheral portion 12a of the substrate 12 positioned opposite to the supporting member 49 in the insertion direction of the server module 43. For example, the cover member 50 has a duct function of transmitting cooling air forced to flow by the fan module(s) 44. In the server 40 of the third embodiment, cooling air flows in a horizontal direction along the front side 14a of the substrate 12. For this reason, openings are formed at the opposite ends of the cover member 50 along the front side 14a of the substrate 12. The cover member 50 is detachably attached to the supporting member 49. The cover member 50 includes a first cover (e.g. a side cover) 54, a second cover (e.g. another side cover) 55, and a third cover (e.g. a cover unit) 56.

The first and second covers 54 and 55 are each formed in a symmetrical shape. The first cover 54 and the second cover 55 are used to cover the front face 12b and the rear face 12c of the substrate 12 except for the connecting members 18. The first and second covers 54 and 55 are formed in plate shapes disposed parallel to the substrate 12. The first and second covers 54 and 55 are equipped with protruding parts (or interlocking parts) 57 which are configured to cover the exterior of the supporting member 49 in the thickness direction of the substrate 12. The protruding parts 57 are formed to protrude downwardly from sides 54a, 55a which are positioned dose to the front side 14a of the substrate 12 when covered by the cover member 50.

Each of the protruding parts 57 has two sides 57a (which are protruded downwardly from the sides 54a, 55a) and another side 57b linearly connecting between two sides 57a. The length L4 of the protruding part 57 along the front side 14a of the substrate 12 is identical to the length L3 of the side face 51a of the supporting member 49. Additionally, the length L5 of the protruding part 57 in its protruding direction is slightly shorter than the height of the supporting member 49, and therefore the side 57b of the protruding part 57 is positioned slightly closer to the sides 54a, 55a of the first and second covers 54, 55 rather than the supporting face 25 of the supporting member 49 in the installed condition in which the substrate 12 is covered by the cover member 50.

The protruding parts 57 are positioned to sandwich the supporting member 49 on the condition that the cover member 50 is attached to the supporting member 49. The protruding part 57 has two locking holes 58 which are formed at positions corresponding to the locking claws 52 of the supporting member 49. When the cover member 50 is attached to the supporting member 49, the locking holes 58 of the protruding parts 57 are engaged with the locking claws 52 of the supporting member 49, thus establishing an interlocked condition of preventing any displacement of the cover member 50 relative to the supporting member 49. To remove the cover member 50 from the supporting member 49, an operator needs to manually broaden a gap between the protruding part 57 of the first cover 54 and the protruding part 57 of the second cover 55, thus releasing the interlocked condition.

The third cover 56 connects the first cover 54 and the second cover 55 together. Specifically, the third cover 56 is formed in a plat shape connecting between sides 54b, 55b opposite to the sides 54a, 55a equipped with the protruding parts 57. The third cover 56 is formed to circumvent the latches 27 attached to the rear side 14b of the substrate 12.

FIG. 7 shows a partial cross section of the server module 43 shown in FIG. 6 along with the line VII-VII, in which the cover member 50 is designed such that the first cover 54 is separated from the second cover 55 in the thickness direction of the substrate 12. This is because it is necessary to secure an adequate space for arranging the heat sink 20, having a relatively large size in the thickness direction of the substrate 12, between the first cover 54 and the substrate 12.

A boss 59 is formed at the center of the supporting member 49 in the thickness direction of the substrate 12. The boss 59 is fixed to the substrate 12 by means of a fastening member 22. That is, the boss 59 is fixed to the substrate 12 by the fastening member 22 such that the boss 59 is positioned to partially overlap the substrate 12 in the thickness direction of the substrate 12.

The power unit 45 converts AC power (which is supplied by another device arranged externally of the server 40) into DC power (which is supplied to internal parts of the server 40), whereby the power unit 45 supplies DC power to the server modules 43 and the fan modules 44 through the baseboard 42.

For example, the communication unit 46 is connected to a metal cable or an optical cable (used for LAN) by another device arranged externally of the server 40. The communication unit 46 is able to communicate with the server modules 43 through the baseboard 42.

According to the third embodiment, it is possible for the supporting member 49 to vertically support the server modules 43. This reduces a space for temporarily holding the server modules 43. As a result, it is possible to improve the workability in attaching or detaching the server modules 43 with the server 40 in a maintenance operation.

Additionally, it is possible to stably hold the server modules 43 in the vertical orientation owing to the supporting face 25 of the supporting member 49. In this connection, it is possible to lower the center of gravity of the server module 43 in the vertical orientation since the supporting member 49 is positioned close to the heat sink 20 attached onto the substrate 12. Thus, it is possible to reliably and stably hold the server modules 43 in the vertical orientation.

According to the third embodiment, the main unit 51 of the supporting member 49 is interposed between the connecting parts 18a, 18b of the substrate 12. This layout may effectively use the intermediate space between the connecting parts 18a and 18b as an installation space of the supporting member 49. As a result, it is possible to suppress the size of the server module 43 from being increased so much. The supporting member 49 is projected forwardly rather than the connecting parts 18a, 18b in the insertion direction; hence, it is possible to prevent the electrodes 19 from being brought into contact with the mounting surface 4 in the vertical orientation f the server module 43.

Owing to the formation of the contact prevention parts 24 in the supporting member 49, it is possible to prevent an operator (conducting a maintenance operation) from accidentally touching the heat sink 20 attached to the substrate 12.

Owing to the locking claws 52 of the supporting member 49 which can be engaged with the locking holes 58 of the cover member 50, it is possible to interlock the supporting member 49 with the cover member 50, which is thus fixed in position. This makes it possible to reduce the size of the server module 43 by effectively using the supporting member 49 as the fixing member for the cover member 50. Additionally, it is possible for an operator to easily remove the cover member 50 from the server module 43 by releasing the interlocked condition between the supporting member 49 and the cover member 50.

Owing to the latches 27 attached to the substrate 12, it is possible for an operator to easily extract the server module 43 from the server-module storage block 41b by holding the latches 27 by hand. This improves the merchantable quality of the server modules 43. Since the latches 27 are positioned opposite to the supporting member 49 with respect to the substrate 12, it is possible for an operator to easily set the server module 43 to the vertical orientation by bringing the server module 43 in contact with the mounting surface 4 while holding the latches 27 by hand.

In particular, the present embodiment can significantly demonstrate an effect of reducing any space for temporarily keeping the server module(s) 43 with respect to the server 40 accommodating numerous server modules 43.

The present invention is not necessarily limited to the foregoing embodiments since the present invention may embrace any variations applicable to the foregoing embodiments within the scope of the invention. That is, the first to third embodiments are illustrative and not restrictive; hence, it is possible to provide any design changes or modifications applicable to those embodiments.

First Variation

Figure 8:
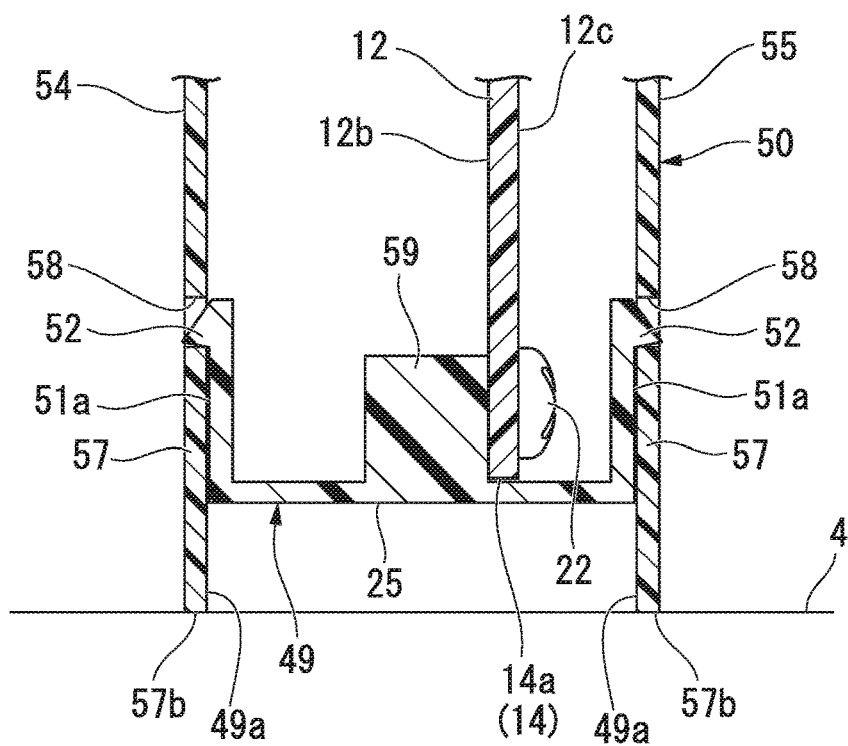
FIG. 8 is a cross-sectional view showing a first variation applied to the supporting member of the server module in conjunction with FIG. 7.

FIG. 8 is a cross-sectional view showing a first variation applied to the supporting member 49 of the server module 43 in conjunction with FIG. 7. The third embodiment is designed to vertically support the server module 43 by means of the supporting member 49; but this is not a restriction. As shown in FIG. 8, it is possible to extend the protruding parts 57 of the cover member 50 so as to elevate the supporting member 49 upwardly, thus providing supports 49a corresponding to the extended parts of the protruding parts 57. Thus, it is possible to support the server module 43 in the vertical orientation with a space below the supporting member 49 above the mounting surface 4.

FIG. 8 shows an example of the supporting member 49 interposed between the substrate 12 and the supporting member 49. However, when the server module 43 is supported by means of the supports 49a of the cover member 50, it is possible to eliminate the supporting member 49 while providing an interconnecting member, which is configured to interconnect the cover member 50 to the substrate 12, at a different position than the setup position of the supporting member 49.

Second Variation

Figure 9:
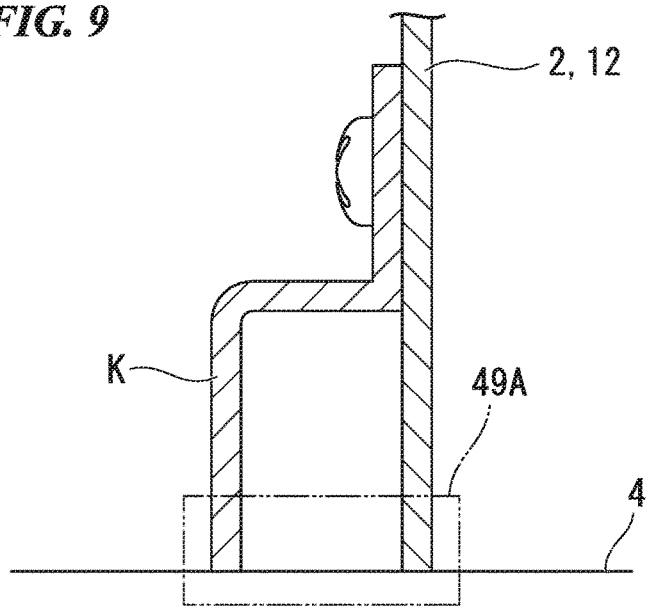
FIG. 9 is a cross-sectional view showing a second variation applied to the supporting member of the server module in conjunction with FIG. 7.

FIG. 9 is a cross-sectional view showing a second variation applied to the supporting member 49 of the server module in conjunction with FIG. 7. The foregoing embodiments (and the first variation) are designed such that the substrates 2, 12 and the server module 43 are supported by the supporting members 3, 13, 49 or the cover member 50; but this is not a restriction. As shown in FIG. 9, it is possible to form a supporting member 49A using part of the substrate 2, 12 in connection with a leg K which is formed and separated from the substrate 2, 12 in its thickness direction. FIG. 9 shows a rectangular-bent shape of the leg K; but this is not a restriction. It is possible to employ any shape for the leg K as well as the leg K can assist the supporting member 40A to support the substrate 2, 12.

Third Variation

Figure 10:
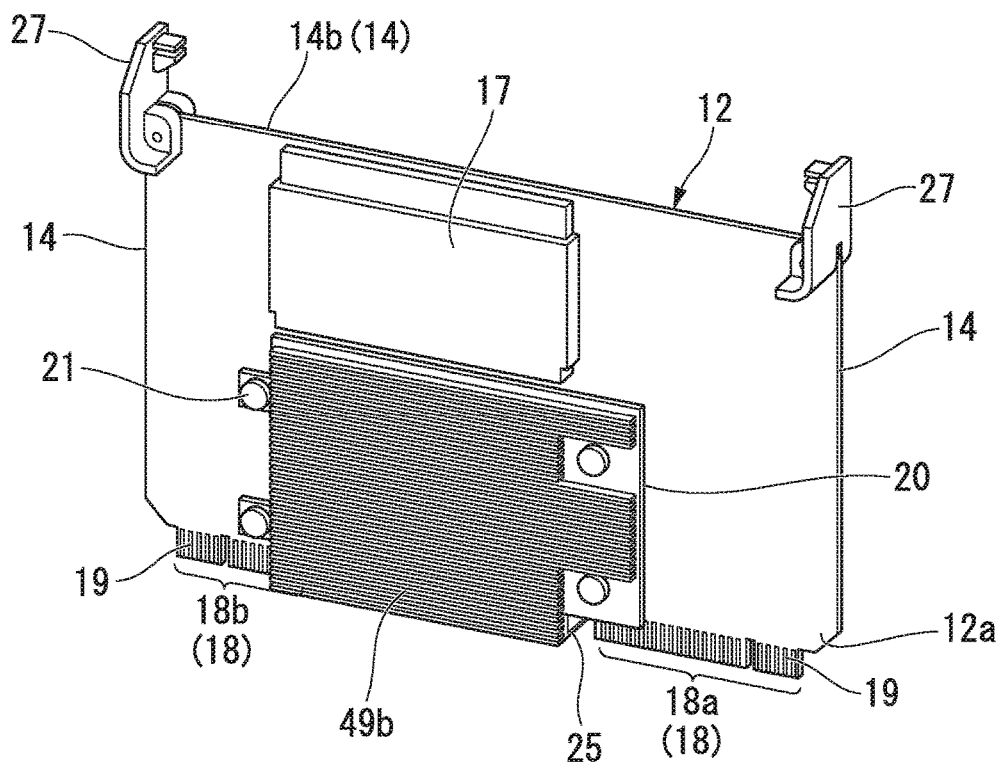
FIG. 10 is a perspective view showing a third variation applied to a heat sink attached to a substrate.

FIG. 10 is a perspective view showing a third variation applied to the heat sink 20 attached to the substrate 12. The foregoing embodiments are designed such that the substrate 12 or the server module 43 is supported by means of the supporting member 13, 49; but this is not a restriction. As shown in FIG. 10, it is possible for the heat sink 20 to provide the supporting part 49b. In other words, the supporting part 49b is integrally formed with the heat sink 20. In this case, part of the heat sink 20 is further extended externally of the substrate 12 so as to form an extended terminal face, which is expanded in the thickness direction of the substrate as an equivalent of the supporting face 25 of the supporting member 13, 49. To attach the cover member 50 to the substrate 12 having the "extended" heat sink 20, it is necessary to provide an interconnecting member configured to interconnect the cover member 50 to the substrate 12.

The third variation refers to the heat sink 20 which is further extended externally of the substrate 12 so as to form the supporting part 49b; but this is not a restriction. Without further extending the heat sink 20 externally of the substrate 12, it is possible to shift the heat sink 20 externally of the substrate 12 so as to form the supporting part 49b.

Fourth Variation

Figure 11:
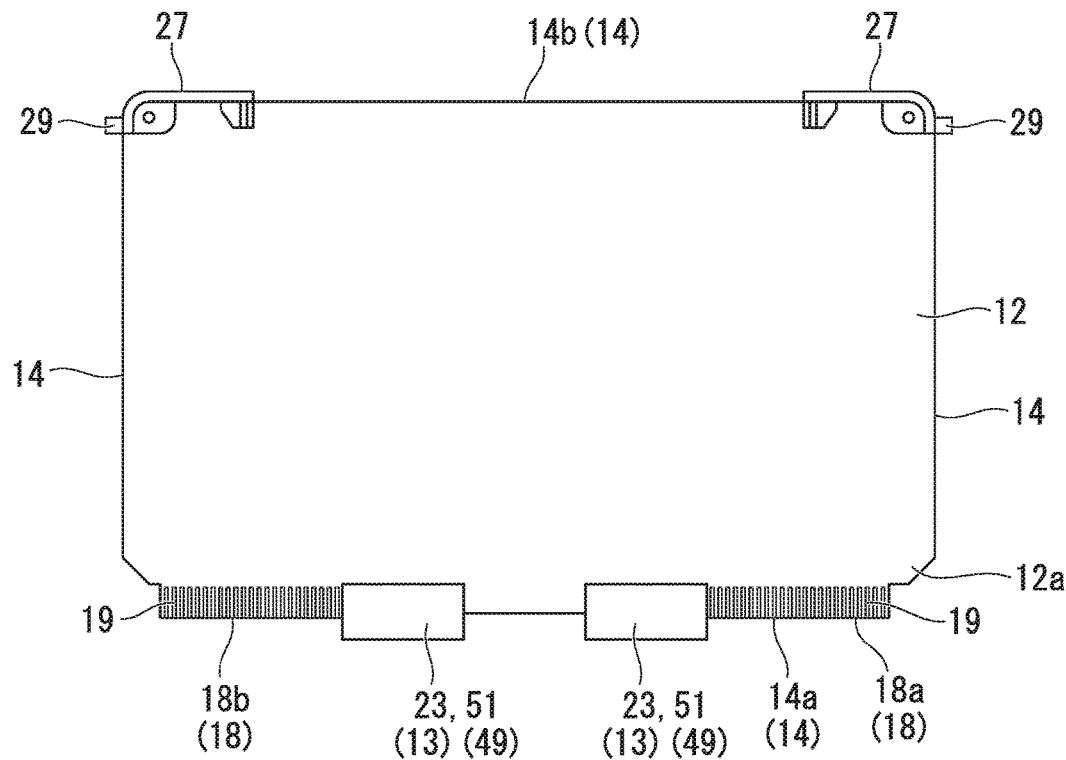
FIG. 11 is a front view showing a fourth variation applied to a supporting member vertically supporting a substrate.

FIG. 11 is a front view showing a fourth variation applied to the support member 13 (49) vertically supporting the substrate 12. The second and third embodiments are designed to provide a single supporting member 13, 49 having a single main unit 23 (51) attached to the front end 14a of the substrate 12; but this is not a restriction. As shown in FIG. 11, it is possible to provide a plurality of main units 23 (51) along the front end 14a of the substrate 12. A plurality of main units 23 (51) can be formed individually or integrally. FIG. 11 shows a plurality of main units 23 (51) interposed between the connecting parts 18a and 18b along the front side 14a of the substrate 12; but this is not a restriction. Thus, a plurality of main units 23 (51) are not necessarily interposed between the connecting parts 18a and 18b.

Fifth Variation

Figure 12:
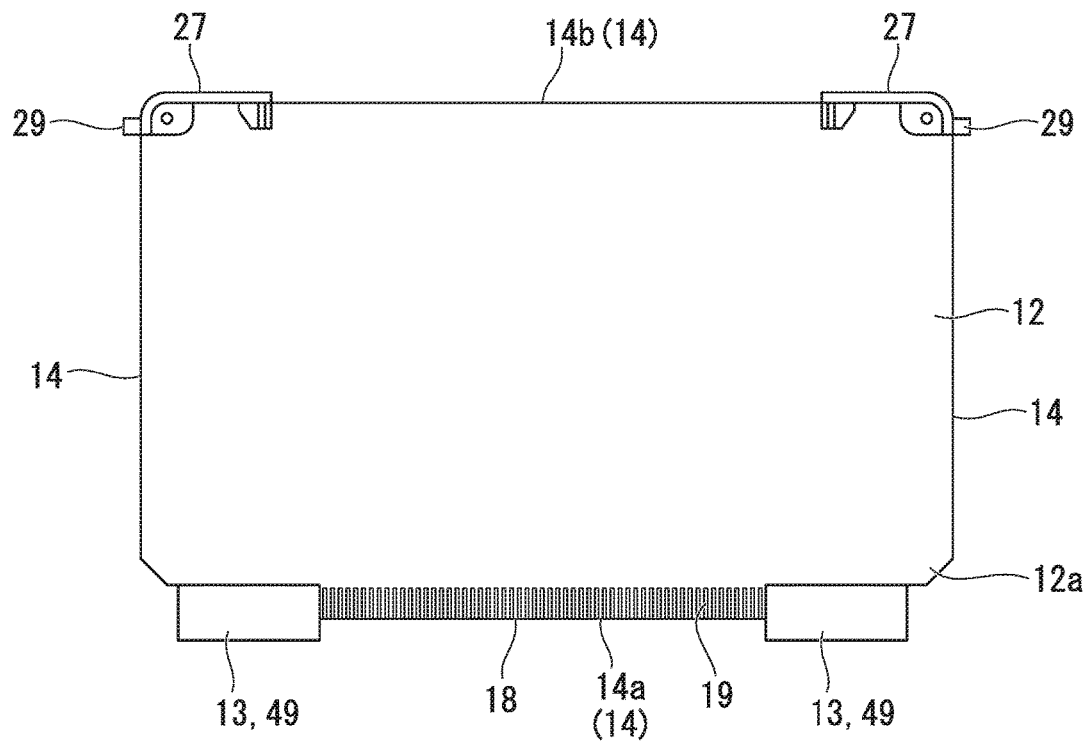
FIG. 12 is a front view showing a fifth variation applied to a connecting part of a substrate.

FIG. 12 is a front view showing a fifth variation applied to the connecting part 18 of the substrate 12. The second and third embodiments are designed such that the connecting part 18 includes a pair of connecting parts 18a, 18b which are separated from each other along the front side 14a of the substrate 12; but this is not a restriction. As shown in FIG. 12, it is possible to provide a single connecting part 18 which is elongated along the front side 14a of the substrate 12.

Additionally, it is possible to arrange the supporting members 13 (49) at the opposite ends interposing a single connecting part 18 attached to the center of the front side 14a of the substrate 12.

Sixth Variation

Figure 13:
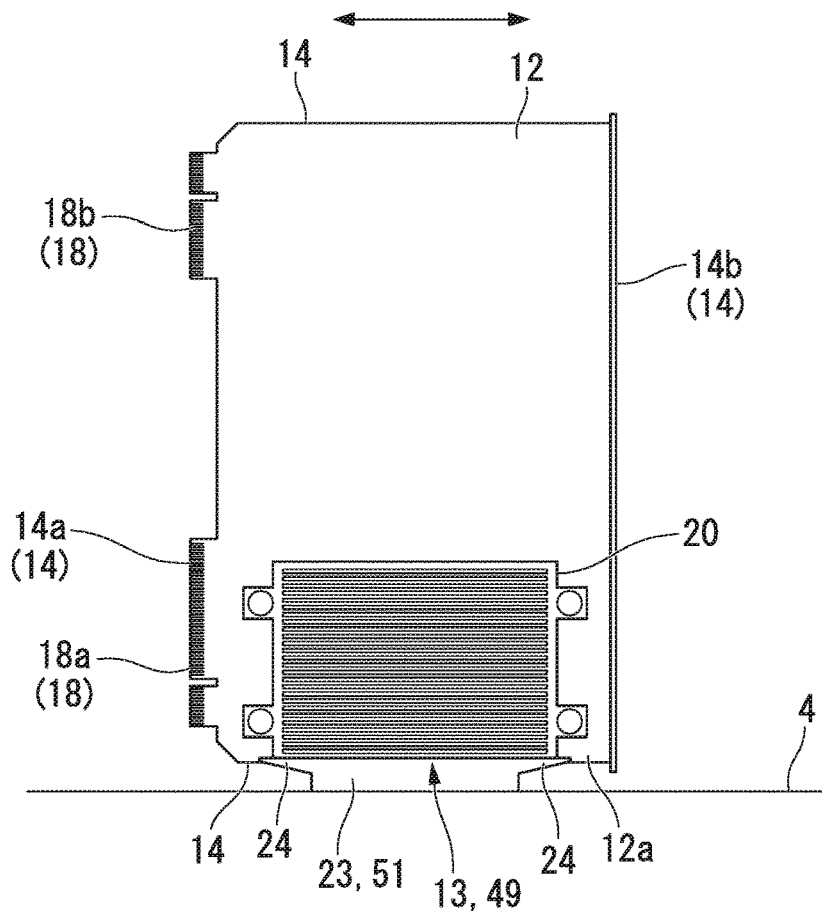
FIG. 13 is a front view showing a sixth variation applied to the layout of a supporting member relative to a substrate.

FIG. 13 is a front view showing a sixth variation applied to the layout of the supporting member 13 (49) relative to the substrate 12. The second and third embodiments (as well as their variations) are designed that the supporting member 13 (49) is attached to the peripheral portion 12a of the substrate 12 in its insertion direction; but the supporting member 13 (49) should not be necessarily attached to the peripheral portion 12a close to the insertion side of the substrate 12.

As shown in FIG. 13, it is possible to attach the supporting member 13 (49) to the peripheral portion 12a along a lateral side 14 (other than the front side 14a among four sides 14 in the forward insertion side) of the substrate 12, wherein a bidirectional arrow shows the insertion/extraction direction of the substrate 12. In this case, it is possible to shift the heat sink 20 to be closer to the supporting member 13 (49). Thus, as similar to the second and third embodiments, it is possible to lower the center of gravity of the substrate 12, thus stabilizing the substrate 12 vertically standing on the mounting surface 4.

In FIG. 13, the supporting member 13 (49) is attached to the peripheral portion 12a along the lateral side 14 perpendicular to the insertion/extraction direction of the substrate 12; but this is not a restriction. Alternatively, it is possible to attach the supporting member 13 (49) to the peripheral portion 12a along the rear side 14b opposite to the front side 14a of the substrate 12 in its insertion/extraction direction.

Seventh Variation

Figure 14:
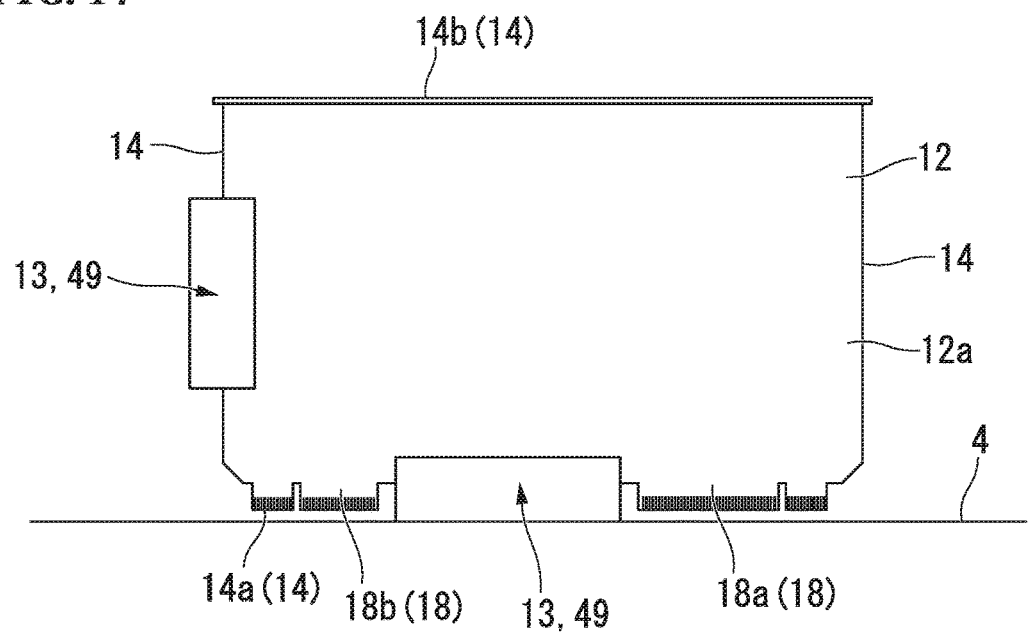
FIG. 14 is a front view showing a seventh variation applied to the layout of supporting members attached to a substrate.

FIG. 14 is a front view showing a seventh variation applied to the layout of supporting members attached to a substrate. The second and third embodiments (as well as their variations) are designed that a single supporting member 13 (49) is attached to a single side 14 among four sides of the substrate 12. As shown in FIG. 14, it is possible to attach a plurality of supporting members 13 (49) to a plurality of sides 14 of the substrate 12.

FIG. 14 shows that a pair of supporting members 13 (49) are attached to a pair of sides 14 adjoining together; but this is not a restriction. A pair of supporting members 13 (49) should not be necessarily attached to adjacent two sides 14 of the substrate 12. For example, it is possible to attach a plurality of supporting members 13 (49) to three or more sides 14 of the substrate 12. Additionally, a plurality of supporting members 13 (49) are not necessarily attached to adjacent sides 14 of the substrate. For example, it is possible to attach a pair of supporting members 13 (49) to a pair of sides 14 which are not adjacent to each other.

In this connection, the fourth to seventh variations show the substrate 12 which is not covered by the cover member 50. Of course, it is possible to attach the cover member 50 to the substrate 12 which is modified according to the fourth to seventh variations.

The appended claims refer to an electronic device having a cover member for use in a server; however, it is possible to provide another aspect of the invention as follows.

(1) A supporting member fixed to the peripheral portion of a substrate so as to support a substrate standing.

(2) The supporting member further includes a main unit fixed to the peripheral portion of a substrate, and at least one contact prevention part protruded from the main unit so as to cover the exterior of a heat sink attached to a substrate.

Lastly, the foregoing embodiments and variations are illustrative and not restrictive; hence, the present invention may embrace any design changes or modifications fallen within the scope of the invention as defined in the appended claims.

What is claimed is:

1. An electronic device comprising: a substrate having a rectangular shape including first and second sides opposite to each other; and a supporting member having a smaller size than the substrate and being configured to support the substrate to stand thereon when the supporting member is positioned generally perpendicular to the substrate, wherein the supporting member has a plane broadened in a thickness direction of the substrate on both faces of the substrate, wherein the supporting member is attached to the first side of the substrate such that at least part of the plane thereof overlaps the substrate in its planar direction, wherein the substrate includes a connecting part which is formed along the first side of the substrate and electrically connectable to an external connector arranged in an outside, and wherein the supporting member projects beyond the connecting part of the substrate when the supporting member is attached to the first side of the substrate at a position different than the connecting part of the substrate.

2. A server comprising: a connector; an electronic device including: a substrate having a rectangular shape with first and second sides opposite to each other, in which a connecting part electrically connectable to the connector is formed along the first side of the substrate; and a supporting member having a smaller size than the substrate and being configured to support the substrate to stand thereon when the supporting member is positioned generally perpendicular to the substrate; and a casing configured to store the electronic device therein when the connecting part of the substrate is connected to the connector, wherein the supporting member has a plane broadened in a thickness direction of the substrate on both faces of the substrate, and the plane being positioned such that at least part of the plane thereof overlaps the substrate in its planar direction, and wherein the supporting member projects beyond the connecting part of the substrate when the supporting member is attached to the first side of the substrate at a position different than the connecting part of the substrate.

3. A cover member comprising: a side cover configured to cover at least a part of faces of a substrate in its thickness direction, wherein the substrate has a rectangular shape with first and second sides opposite to each other; and a cover unit configured to cover the second side of the substrate opposite to the first side of the substrate at which a supporting member having a smaller size than the substrate is attached such that the supporting member supports the substrate to stand thereon when the supporting member is positioned generally perpendicular to the substrate, wherein the cover unit includes an interconnecting member connectible to the supporting member, wherein the supporting member has a plane broadened in the thickness direction of the substrate on both faces of the substrate and is positioned such that at least part of the plane thereof overlaps the substrate in its planar direction, wherein the substrate includes a connecting part which is formed along the first side of the substrate and electrically connectable to an external connector arranged in an outside, and wherein the supporting member projects beyond the connecting part of the substrate when the supporting member is attached to the first side of the substrate at a position different than the connecting part of the substrate.

4. An electronic device comprising:
a substrate having a rectangular shape with first and second sides opposite to each other;
a supporting member having a smaller size than the substrate and being attached to the first side of the substrate so as to support the substrate to stand thereon when the supporting member is positioned generally perpendicular to the substrate,
wherein the supporting member has a plane broadened in a thickness direction of the substrate on both faces of the substrate,
wherein the substrate is equipped with a heatsink at a position closer to the first side of the substrate deviated from a center of the substrate, and
wherein the supporting member is integrally formed with the heatsink and disposed in connection with the first side of the substrate.

5. The electronic device according to claim 1, wherein the substrate has a center of gravity closer to the first side of the substrate than a center of the substrate, and
wherein the supporting member is disposed along the first side of the substrate close to the center of gravity.

6. The electronic device according to claim 1, wherein the connecting part of the substrate is divided into first and second connecting parts electrically connectable to first and second connectors disposed in an outside,
wherein the first and second connecting parts are separated from each other along the first side of the substrate, and
wherein the supporting member is attached to a center portion of the first side of the substrate interposed between the first and second connecting parts when the supporting member is attached to the first side of the substrate.

7. The electronic device according to claim 1, wherein the substrate further includes a heatsink, and the supporting member is disposed at a position adjacent to the heatsink in the first side of the substrate.

8. The electronic device according to claim 7, wherein the supporting member includes a contact prevention part configured to cover the heatsink in its outer periphery.

9. The electronic device according to claim 1, further comprising a cover member configured to cover at least part of the substrate, wherein the supporting member includes an interconnecting member configured to connect the substrate and the cover member.

10. The electronic device according to claim 1, further comprising a cover member configured to cover at least part of the substrate, and wherein the cover member is equipped with the supporting member.

11. A supporting member adapted to a substrate having a rectangular shape with first and second sides opposite to each other in which a connecting part electrically connectable to an external connector is formed along the first side of the substrate, comprising:
a fixed part which is fixed to the first side of the substrate so as to support the substrate to stand thereon, the fixed part having a smaller size than the substrate; and
a plane broadened in a thickness direction of the substrate on both faces of the substrate, the plane being positioned such that at least part of the plane thereof overlaps the substrate in its planar direction,
wherein the fixed part projects beyond the connecting part when fixed to the first side of the substrate at a position different than the connecting part of the substrate.

12. The supporting member according to claim 11, further comprising:
a main unit including the fixed part; and
a contact prevention part configured to project from the main unit so as to cover a heatsink attached to the substrate in its outer periphery.

* * * * *